United States Patent
Chang et al.

(10) Patent No.: US 11,600,800 B2
(45) Date of Patent: Mar. 7, 2023

(54) ELECTRONIC DEVICE HAVING A CURVED PROFILE INTERFACE CORRESPONDING TO A RECESS

(71) Applicants: Ardour Chang, Tainan (TW); Joe Liu, Hsinchu (TW)

(72) Inventors: Ardour Chang, Tainan (TW); Joe Liu, Hsinchu (TW)

(73) Assignee: Innolux Corporation, Miao-Li County (TW)

( * ) Notice: Subject to any disclaimer, the term of this patent is extended or adjusted under 35 U.S.C. 154(b) by 39 days.

(21) Appl. No.: 16/944,151

(22) Filed: Jul. 31, 2020

(65) Prior Publication Data

US 2022/0037619 A1 Feb. 3, 2022

(51) Int. Cl.
| | |
|---|---|
| H01L 51/52 | (2006.01) |
| H01L 33/44 | (2010.01) |
| H01L 23/00 | (2006.01) |
| H01L 27/146 | (2006.01) |
| G02F 1/1335 | (2006.01) |
| G02F 1/1333 | (2006.01) |
| H01L 27/32 | (2006.01) |
| G06F 1/16 | (2006.01) |
| G09F 9/30 | (2006.01) |

(52) U.S. Cl.
CPC .... *H01L 51/5253* (2013.01); *G02F 1/133331* (2021.01); *G02F 1/133528* (2013.01); *G06F 1/1641* (2013.01); *G06F 1/1652* (2013.01); *G09F 9/301* (2013.01); *H01L 23/564* (2013.01); *H01L 27/14678* (2013.01); *H01L 27/323* (2013.01); *H01L 27/3223* (2013.01); *H01L 33/44* (2013.01); *H01L 51/5218* (2013.01); *H01L 51/5246* (2013.01); *H01L 51/5271* (2013.01); *H01L 51/5293* (2013.01); *H01L 2251/301* (2013.01)

(58) Field of Classification Search
CPC .......... H01L 51/5253; H01L 2251/301; H01L 33/44; H01L 23/564; H01L 51/0097; H01L 51/5293; H01L 51/5246; H01L 51/5218; H01L 51/5271; H01L 2251/5338; H01L 27/323; H01L 27/14678; H01L 27/3223; G02F 1/133331; G02F 1/133528; G06F 1/1641; G06F 1/1652; G09F 9/301
See application file for complete search history.

(56) References Cited

U.S. PATENT DOCUMENTS

| | | | | |
|---|---|---|---|---|
| 10,673,020 | B2 * | 6/2020 | Kim | H01L 27/3244 |
| 10,804,348 | B2 * | 10/2020 | Kim | H01L 27/3246 |
| 10,840,478 | B2 * | 11/2020 | Han | H01L 27/3276 |
| 10,873,053 | B2 * | 12/2020 | Sung | H01L 27/323 |
| 10,930,885 | B2 * | 2/2021 | Kim | H01L 27/3227 |
| 10,964,913 | B2 * | 3/2021 | Moon | H01L 51/5253 |
| 2019/0051859 | A1 | 2/2019 | Choi et al. | |
| 2019/0081273 | A1 | 3/2019 | Sung et al. | |

(Continued)

*Primary Examiner* — Ida M Soward
(74) *Attorney, Agent, or Firm* — Patterson + Sheridan, LLP

(57) ABSTRACT

An electronic device is provided. The electronic device includes a substrate, an inorganic layer, and an organic layer. The substrate has a recess with a side portion. The inorganic layer is disposed on the substrate. The organic layer is disposed on the inorganic layer, wherein the organic layer and the inorganic layer have an interface, the interface includes a first part corresponding to the side portion of the recess, and the first part has a curved profile.

17 Claims, 4 Drawing Sheets

(56) References Cited

U.S. PATENT DOCUMENTS

| | | | |
|---|---|---|---|
| 2019/0148672 A1 | 5/2019 | Seo et al. | |
| 2019/0288047 A1 | 9/2019 | Jeong et al. | |
| 2019/0334120 A1* | 10/2019 | Seo | H01L 51/5253 |
| 2019/0355930 A1* | 11/2019 | Lee | H01L 51/5256 |
| 2020/0064968 A1* | 2/2020 | Kim | H01L 27/3276 |
| 2020/0119304 A1* | 4/2020 | Choi | H01L 51/5253 |
| 2020/0161582 A1* | 5/2020 | Choi | H01L 27/326 |
| 2020/0168671 A1* | 5/2020 | Jang | H01L 51/5253 |
| 2020/0176520 A1* | 6/2020 | Kim | H01L 51/5253 |
| 2020/0176709 A1* | 6/2020 | Moon | G06F 3/0412 |
| 2020/0212353 A1* | 7/2020 | Kim | H01L 51/5246 |
| 2020/0235333 A1* | 7/2020 | Sung | H01L 51/0096 |
| 2020/0321561 A1* | 10/2020 | Park | H01L 51/5281 |
| 2020/0343481 A1* | 10/2020 | Lee | H04M 1/0266 |
| 2020/0401273 A1* | 12/2020 | Bang | H01L 27/3288 |
| 2021/0036064 A1* | 2/2021 | Jang | G06F 3/0446 |
| 2021/0057678 A1* | 2/2021 | Motoyama | H01L 51/5275 |
| 2021/0111374 A1* | 4/2021 | Sung | H01L 27/3258 |
| 2021/0151715 A1* | 5/2021 | Lee | H01L 27/3258 |
| 2021/0210723 A1* | 7/2021 | Han | H01L 51/5253 |
| 2021/0217992 A1* | 7/2021 | Moon | G06F 3/0443 |
| 2021/0234122 A1* | 7/2021 | Choi | H01L 51/5253 |
| 2021/0343986 A1* | 11/2021 | Zheng | H01L 51/5256 |
| 2021/0408458 A1* | 12/2021 | Lu | H01L 51/5253 |
| 2022/0037442 A1* | 2/2022 | Liu | H01L 27/3272 |

\* cited by examiner

ELECTRONIC DEVICE HAVING A CURVED PROFILE INTERFACE CORRESPONDING TO A RECESS

BACKGROUND OF THE DISCLOSURE

Field of the Disclosure

The disclosure relates to an electronic device, and particularly to a structure in a periphery region of a display panel.

Description of the Related Art

It is necessary to reinforce the structure in a periphery region of a soft display panel to reduce the possibility that the display panel is stripped due to bending. In this disclosure, a new structure in the periphery region is provided, and the process yield is increased because of the enhancement of the structure.

BRIEF DESCRIPTION OF THE DISCLOSURE

An electronic device is provided in some embodiments of the present disclosure. The electronic device includes a substrate, an inorganic layer, and an organic layer. The substrate has a recess with a side portion. The inorganic layer is disposed on the substrate. The organic layer is disposed on the inorganic layer, wherein the organic layer and the inorganic layer have an interface, the interface includes a first part corresponding to the side portion of the recess, and the first part has a curved profile.

BRIEF SUMMARY OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
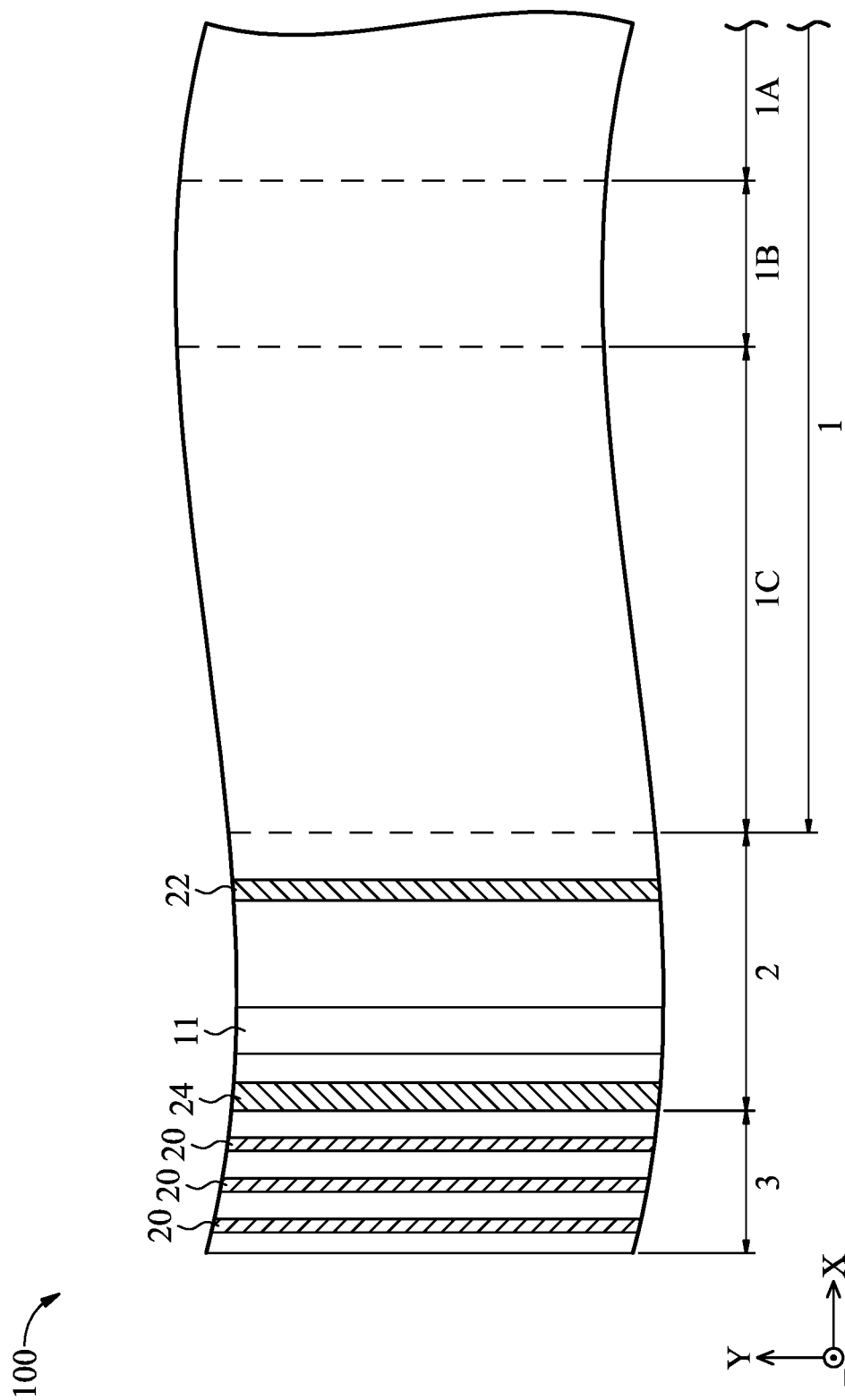
FIG. 1 is a top view of an electronic device in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 2:
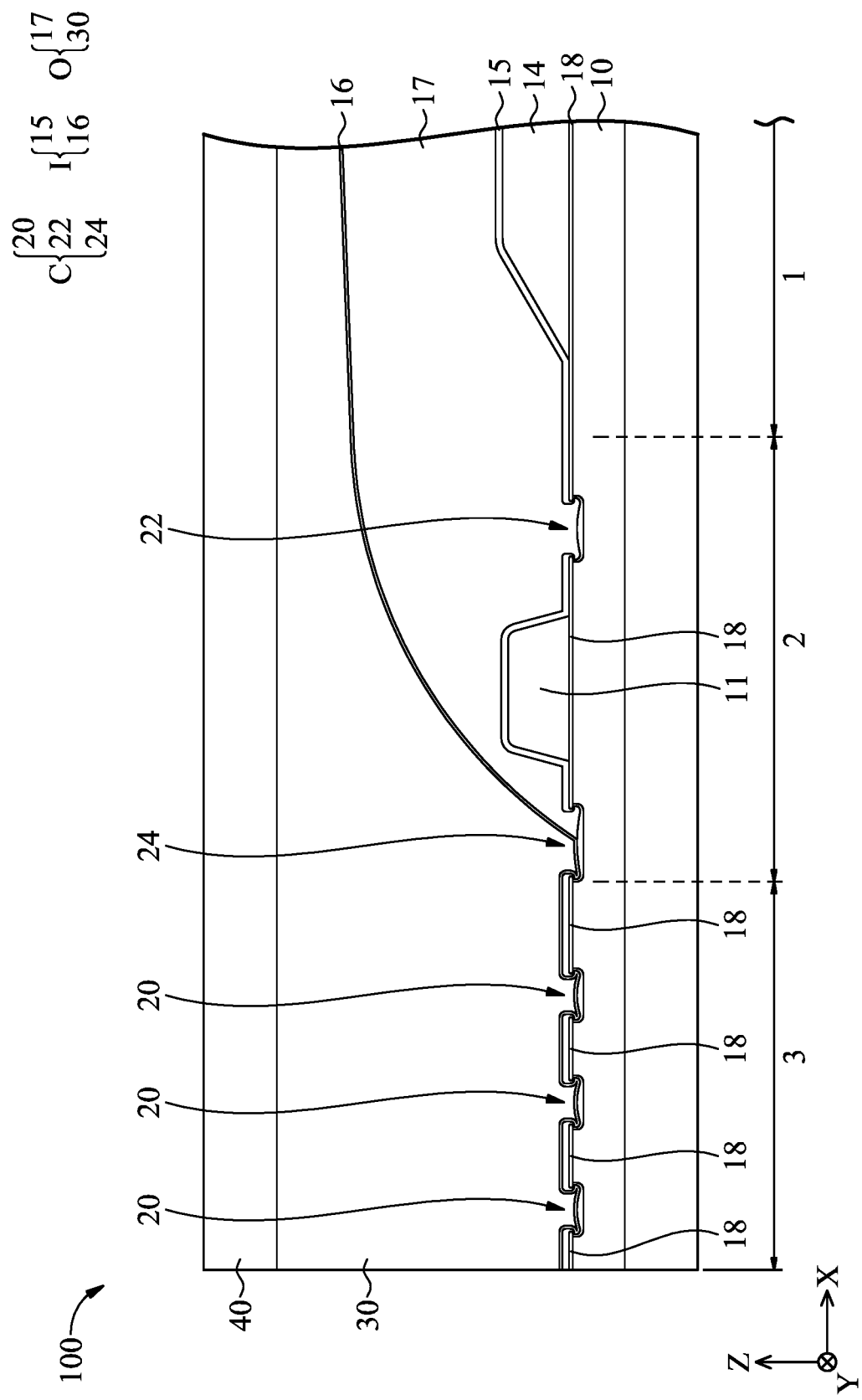
FIG. 2 is a cross-sectional view of the electronic device in some embodiments of the present disclosure.

Refer to FIG. 1 and FIG. 2, wherein FIG. 1 is a top view of an electronic device 100 in some embodiments of the present disclosure, and FIG. 2 is a cross-sectional view of the electronic device 100 in some embodiments of the present disclosure. The electronic device 100 may be a display device, and a panel of the display device may include a substrate, such as a soft substrate or a flexible substrate, but the present disclosure the present disclosure is not limited thereto. The display device may include liquid crystal (LC) display devices, organic light-emitting diode (OLED) display devices, quantum dot (QD) display devices, fluorescent material display devices, phosphor material display devices, light-emitting diode (LED) display devices, such as mini LED or micro LED display devices, or other display devices. It should be noted that organic light-emitting diode display devices are used as examples of the electronic device in the present disclosure for illustration, but the present disclosure is not limited thereto. For example, the electronic device may be a sensing device, an antenna device, a combination thereof, or a tiled electronic device.

As shown in FIG. 1, the electronic device 100 may include an active region 1A, a dummy thin-film transistor region (dummy TFT region) 1B, a wiring region 1C, an overflow region 2, and a package region 3, but the present disclosure is not limited thereto. In this disclosure, the active region 1A may include a plurality of wirings, a plurality of transistors, and a plurality of electrodes to form electronic elements, such as the sub-pixels in a display device, but not limited thereto. In some embodiments, the active region 1A, the dummy TFT region 1B, and the wiring regions 1C may be called as a device region 1. In some embodiments, the electronic device 1 may include other regions, depending on design requirements.

As shown in FIG. 2, the electronic device 100 may mainly include a substrate 10, a buffer layer 18, an inorganic layer I (which may include a first inorganic layer 15 and/or a second inorganic layer 16), and an organic layer O (which may include a first organic layer 30 and/or a second organic layer 17), a light-emitting diode layer (not shown), and a reflective electrode layer (not shown) in a cross-sectional view, but it is not limited thereto. In some embodiments, an electronic element 14 may be disposed on the device region 1, such as the active element. For example, as shown in FIG. 2, the electronic elements 14 may be disposed on the substrate 10, and the buffer layer 18 may be located between the electronic element 14 and the substrate 10. In some embodiments, a cover layer 40 may be disposed above a first organic layer 30. For example, the cover layer 40 may include a touch control layer, a polarizing layer, a protective layer (such as glass), other suitable layers or a combination thereof, but the present disclosure is not limited thereto.

In some embodiments, when the electronic device 100 is a display device, the active region 1A may be a display region, and the dummy TFT region 1B, the wiring region 1C, the overflow region 2, and the package region 3 may be a periphery region (or a non-display area), but the present disclosure is not limited thereto. The periphery region may be located at an edge region of a display panel. Alternatively, if a through hole is formed on the display panel (such as the through hole on a display panel of a cell phone for a camera module), the periphery region may be located at a border region between the through hole and the display region. In some embodiments, the width of the periphery region (such as the total width of the dummy TFT region 1B, the wiring region 1C, the overflow region 2, and the package region 3 in FIG. 1) may be less than 1 mm to reduce the width of the bezel of the display device. In some embodiments, the periphery region may include other features, depending on design requirements. In some embodiments, the width of the package region 3 (such as the width in X direction) may be less than about 400 but the present disclosure is not limited thereto.

Figure 3:
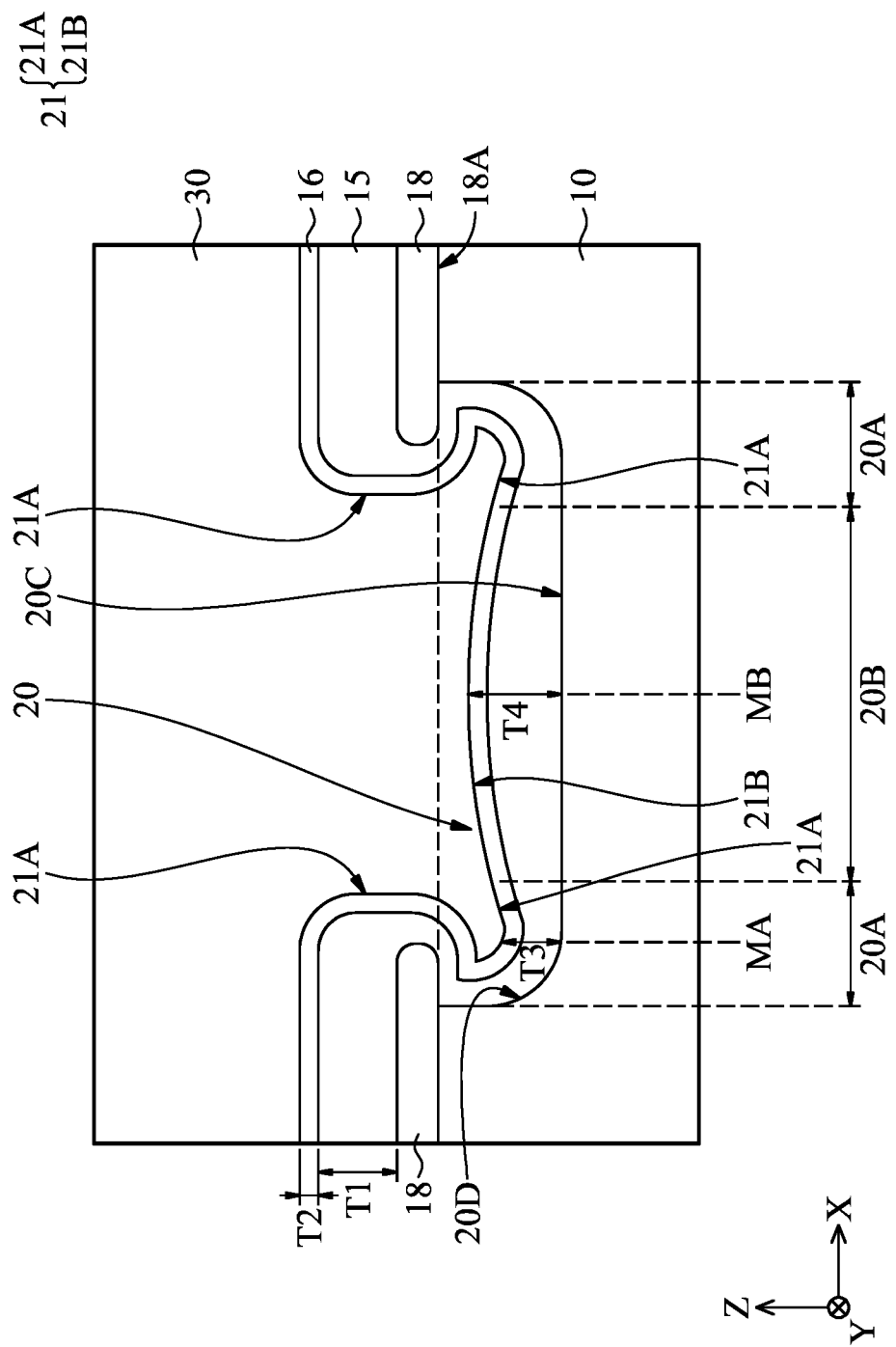
FIG. 3 is a cross-sectional view of a recess in some embodiments of the present disclosure.
Figure 4:
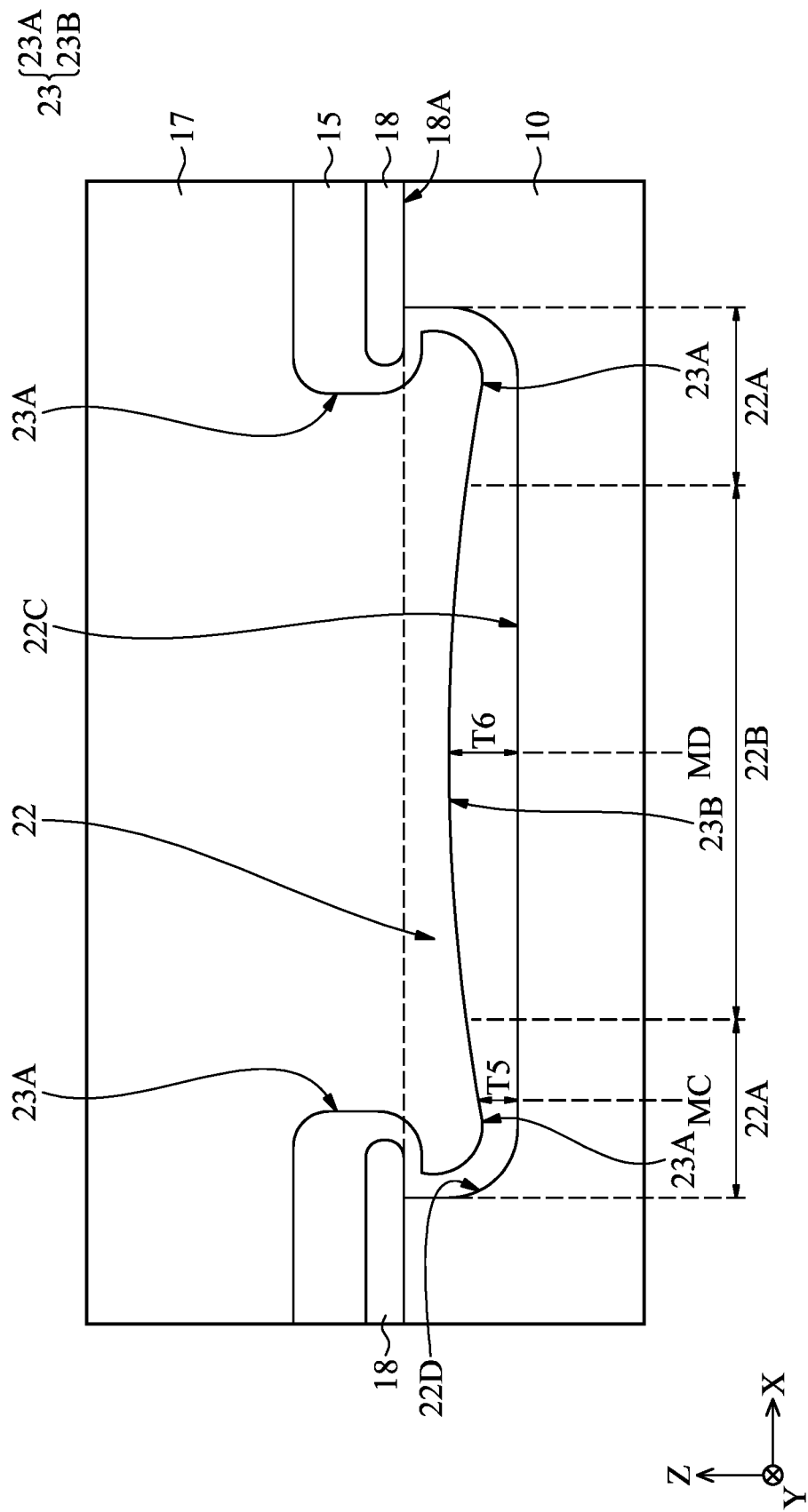
FIG. 4 is a cross-sectional view of a recess in some embodiments of the present disclosure.

The substrate 10 may include a plurality of recesses in the periphery region, such as a recess 20, a recess 22, and/or a recess 24. The number of the recess 20, the recess 22, and the recess 24 in FIG. 1 and FIG. 2 is only for illustration, and the number of the recess 20, the recess 22, and the recess 24 may be changed based on design requirements. For example, as shown in FIG. 1 and FIG. 2, the substrate 10 may include a plurality of recesses 20, a recess 22, and a recess 24, but the present disclosure is not limited thereto. Referring to FIG. 3 and FIG. 4, the recess may include side portions (such as the side portions 20A of the recess 20 or the side portions 22A of the recess 22, etc.) and a central portion (such as the central portion 20B of the recess 20 or the central portion 22B of the recess 22, etc.), which will be described in detail later. In some embodiments, the substrate 10 may be bent by force. In some embodiments, the substrate 10 may include suitable flexible materials, such as polycarbonate, polyimide, polypropylene, polyethylene terephthalate, other suitable materials or a combination thereof, but the present disclosure is not limited thereto.

As shown in FIG. 2, the inorganic layer I may be disposed on the substrate 10, and the first organic layer 30 may be disposed on the inorganic layer I. For example, the first inorganic 15 may be disposed on the substrate 10, and the second organic layer 17 may be disposed on the first inorganic layer 15. The second inorganic layer 16 may be disposed on the substrate 10, and a portion of the first inorganic 15 may be disposed between the second inorganic layer 16 and the substrate 10, such as shown at the left side of FIG. 2, or a portion of the first inorganic layer 15 and at least a portion of the second organic layer 17 may be located between the second inorganic layer 16 and the substrate 10, as shown at the right side of FIG. 2, it depends on design requirements. Furthermore, in some embodiments, at least a portion of the first organic layer 30 may be disposed on the first inorganic layer 15 and/or the second inorganic layer 16. In some embodiments, a portion of the first inorganic layer 15, a portion of second inorganic layer 16, and a portion of the first organic layer 30 may be disposed in the recess 20 and/or the recess 24, but the present disclosure is not limited thereto.

In some embodiments, the first inorganic layer 15 and the second inorganic layer 16 may include an identical material or different materials, but the present disclosure is not limited thereto. For example, the first inorganic layer 15 and/or the second inorganic layer 16 may be formed by tetraethylorthosilicate (TEOS), $O_2$, Ar, $NF_3$, $SiH_4$, $N_2O$, $NH_3$, $N_2$, other suitable materials, or a combination thereof, but the present disclosure is not limited thereto. In some embodiments, the first inorganic layer 15 and/or the second inorganic layer 16 may be formed by physical vapor deposition (PVD) process, chemical vapor deposition (CVD) process, coating, other suitable methods, or a combination thereof. For example, the physical vapor deposition process may include sputtering, vapor deposition, pulsed laser deposition, etc., but the present disclosure is not limited thereto. For example, the chemical vapor deposition process may include low-pressure CVD (LPCVD), low-temperature CVD (LTCVD), rapid-thermal CVD (RTCVD), plasma-enhanced CVD (PECVD), or atomic layer deposition (ALD), but the present disclosure is not limited thereto.

In some embodiments, the first organic layer 30 and the second organic layer 17 may include different materials, but the present disclosure is not limited thereto. For example, the material or the first organic layer 30 may include epoxy acrylates, polyester acrylate, urethane acrylate, photosensitive polyimide, phenolic epoxy resin, siloxane, other suitable materials, or a combination thereof, but the present disclosure is not limited thereto. The second organic layer 17 may include flowable glue, or may include pressure sensitive adhesive, heat curing adhesive, light curing adhesive, hot melt adhesive, moisture curing adhesive, AB glue, etc., but the present disclosure is not limited thereto. In some embodiments, the first organic layer 30 and the second organic layer 17 may include identical materials.

In some embodiments, the substrate 10 may further include a convex portion 11 disposed on a top surface of the substrate 10, and the convex portion 11 may be located between the recess 22 and the recess 24, to be more specific, the recess 24 is located between the recess 20 and the convex portion 11. The convex portion 11 at least partially overlaps the second organic layer 17 in the normal direction of the substrate 10 (i.e. Z direction). The possibility that the flowable second organic layer 17 flows into the recess 20 at the package region 3 will be reduced by providing the convex portion 11, the recess 22, and the recess 24 on the substrate 10. For example, the convex portion 11 can limit the second organic layer 17 from overflowing, and the redundant or overflowed second organic layer 17 may be accommodated in the recess 22 and the recess 24. In some embodiments, a portion of the recess 24 is covered by the second organic layer 17 and another portion of the recess 24 is exposed. In other words, a portion of the first organic layer 30 and a portion of second organic layer 17 may be disposed in the recess 24, and the first inorganic layer 15 direct contacts and overlapping the second inorganic layer 16 in the recess 24, but the present disclosure is not limited thereto. Although the second organic layer 17 is disposed on the convex portion 11 and disposed in the recess 22 and the recess 24 in FIG. 2, the present disclosure is not limited thereto. For example, the second organic layer 17 may be not located in the recess 24, or be blocked by the convex portion 11 rather than totally covering the convex portion 11, it depends on design requirements and/or processing parameters.

Because organic light-emitting diode display device is used as an example in the present disclosure, the electronic element 14 may include organic light-emitting diode (OLED) in some embodiments. Alternatively, if the electronic device is other types of display devices, antenna devices or sensing devices, the electronic element 14 may include quantum dot light-emitting diode (QLED/QDLED), light-emitting diodes which includes micro light-emitting diode (micro LED) or mini light emitting diode (mini LED), transceiver unit of the antenna device or sensing unit of the sensing device. In some embodiments, the electronic element 14 may include thin film transistors, such as top-gate thin film transistors, bottom-gate thin film transistors, multi-gate thin film transistors, and their channel region may include amorphous silicon, low temperature poly-silicon (LTPS), or metal oxide. The thin film transistors may be located on the dummy TFT region 1B of the device region 1. In some embodiments, the electronic element 14 may also include wirings.

In some embodiments, the buffer layer 18 may be disposed over the substrate 10, and other elements may be disposed over the buffer layer 18. For example, the buffer layer 18 may be disposed between the substrate 10 and the inorganic layer I, such as the buffer layer 18 may be disposed between the substrate 10 and the first inorganic layer 15, or the convex portion 11 or the electronic element 14 may be disposed on the buffer layer 18. As shown in FIG. 3, the buffer layer 18 partially overlaps the recess 20 in the normal direction of the substrate 10 (e.g. Z direction). In some embodiments, the buffer layer may be formed by physical vapor deposition, chemical vapor deposition, coating, other suitable methods, or a combination thereof. For example, the physical vapor deposition process may include sputtering, vapor deposition, pulsed layer deposition, etc., but the present disclosure is not limited thereto. For example, the chemical vapor deposition process may include low-pressure CVD (LPCVD), low-temperature CVD (LTCVD), rapid-thermal CVD (RTCVD), plasma-enhanced CVD (PECVD), or atomic layer deposition (ALD), but the present disclosure is not limited thereto. It should be noted that the buffer layer 18 is extruded and partially overlaps the recesses 20, so that the first organic layer 30 may be partially embedded in the buffer layer 18 to further strengthen the structure in the periphery region of the display panel.

In some embodiments, the buffer 18 may be formed of insulating materials, but the present disclosure is not limited thereto. The material of the buffer layer 18 may include organic material, inorganic material, or a combination thereof, but the present disclosure is not limited thereto. The organic material may include polyethylene terephthalate (PET), polyethylene (PE), polyethersulfone (PES), polycarbonate (PC), polymethylmethacrylate (PMMA), isoprene, phenol-formaldehyde resin, benzocyclobutene (BCB), perfluorocyclobutane (PECB), or a combination thereof, but the present disclosure is not limited thereto. In some embodiments, the inorganic material may include silicon oxide, silicon nitride, silicon oxynitride, aluminum oxide, aluminum nitride, aluminum oxynitride, titanium oxide, other suitable materials, or a combination thereof, but the present disclosure is not limited thereto.

In some embodiments, the buffer layer 18 may be a single layer structure. In other embodiments, the buffer layer 18 may include a plurality of sub-layers. In the embodiments where the buffer layer 18 includes a plurality of sub-layers, the sub-layers may have identical or different materials, depending on the design requirements.

In some embodiments, the buffer layer 18 may be formed on the substrate 10, and then a portion of the buffer layer 18 may be removed by patterning processes to expose the substrate 10. In some embodiments, the patterning processes may include a photolithography process and an etching process, but the disclosure is not limited thereto. The photolithography processes may include photoresist coating (e.g., spin coating), soft baking, hard baking, mask aligning, exposure, post-exposure baking, developing the photoresist, rinsing, drying, or another suitable process, but the present disclosure is not limited thereto. The etching process may include dry etching process, but the present disclosure is not limited thereto. Afterwards, the exposed substrate 10 may be recessed by laser heating to form the recess 20, the recess 22, and the recess 24. Although the recess 20 in FIG. 1 is shown as a groove, the present disclosure is not limited thereto. For example, the recess 20 may include a blind hole or other structure, depending on design requirements. In some embodiments, the recess 22 or the recess 24 may include a groove that surrounds the device region 1.

FIG. 3 is a cross-sectional view of a recess 20 in some embodiments of the present disclosure. In some embodiments, as shown in FIG. 3, an interface 21 may be located between the first organic layer 30 and the inorganic layer I (specifically, second inorganic layer 16), and the interface 21 may include a first part 21A and a second part 21B. The first part 21A may correspond to the side portion 20A, and the first part 21A is S-shaped in the cross sectional view, and the second part 21B may correspond to the central portion 20B of the recess 20. In other words, the first part 21A may be the interface between the second inorganic layer 16 and the first organic layer 30 at the side portion 20A, and the second part 21B may be the interface between the second inorganic layer 16 and the first organic layer 30 at the central portion 20B. In some embodiments, the first part 21A and the second part 21B may have curved profiles.

In this disclosure, in a direction that is perpendicular to the normal direction of the substrate 10 (such as the X direction in FIG. 3), the side portions 20A of the recess 20 may be defined as the portions of the recess 20 that have one fifth (⅕) of the total width of the recess 20 calculated from the left side and right side of the recess 20, and the central portion 20B may be defined as the portion of the recess 20 that at the central position and has three fifths (⅗) of the total width of the recess. For example, as shown in FIG. 3, the width of each of the side portions 20A at the left side and the right side of the central portion 20B is respectively one third (⅓) of the width of the central portion 20B in X direction.

In some embodiments, the curved profile of the first part 21A may be located in the recess 20, such as a space located between an extending plane (shown by a dashed line) of a bottom surface 18A of the buffer layer 18 and a bottom surface 20C of the recess 20. Furthermore, in some embodiments, the curved profile of the first part 21A may be located outside of the recess 20, such as higher than one side of the extending plane of the bottom surface 18A of the buffer layer 18 in Z direction. The curved profile of the interface 21 (which includes the first part 21A and the second part 21B)

may reduce the occurrence of turbulent flow when disposing the liquid raw material of the first organic layer 30 flowing into the recess 20 (no matter the turbulent flow occurs inside the recess 20 or outside of the recess 20), and the chance to form a gap between the first organic layer 30 and the second inorganic layer 16 may be reduced, the combination of the first organic layer 30 and the second inorganic layer 16 may be better.

Referring to FIG. 3, in some embodiments, the thickness T1 of the first inorganic layer 15 may be greater than the thickness T2 of the second inorganic layer 16, but the present disclosure is not limited thereto. In some embodiments, the thickness T4 of the inorganic layer I (which includes the first inorganic layer 15 and the second inorganic layer 16) at the central portion 20B may be greater than the thickness T3 of the inorganic layer I at the side portion 20A, but the present disclosure is not limited thereto. For example, the thickness T1 and the thickness T2 may be the maximum thicknesses on the buffer layer 18, and may be measured in a normal direction of the substrate 10 (e.g., Z direction in FIG. 3). In the recess 20, the thickness T3 may be the distance measured from the bottom of the inorganic layer I to the top of the inorganic layer at a central point MA, wherein the central point MA is a central point of a side portion 20A in X direction. Similarly, the thickness T4 may be the distance measured from the bottom of the inorganic layer I to the top portion of the inorganic layer I at a central point MB of the central portion 20B. It should be noted that although the thickness of the second inorganic layer 16 in FIG. 3 is shown as substantially identical in different positions, but the thickness of the second inorganic layer 16 may change in different positions, such as the thickness of the second inorganic layer 16 that is closer to a side surface 20D of the recess 20 may be less than the thickness of the inorganic layer 16 that corresponds to the central portion 20B of the recess 20.

FIG. 4 is a cross-sectional view of the recess 22 in some embodiments of the present disclosure. In some embodiments, as shown in FIG. 4, a portion of the first inorganic layer 15 and a portion of the second organic layer 17 are disposed in the recess 22, and an interface 23 may be located between the second organic layer 17 and the first inorganic layer 15, and the interface 23 may include a first part 23A and a second part 23B. The first part 23A may correspond to a side portion 22A of the recess 22, and the second part 23B may correspond to a central portion 22B of the recess 22. In other words, the first part 23A may be the interface between the first inorganic layer 15 and the second organic layer 17 at the side portion 22A, and the second part 23B may be the interface between the first inorganic layer 15 and the second organic layer 17 at the central portion 22B. In some embodiments, the first part 23A and the second part 23B may have curved profiles. It should be noted that no second inorganic layer 16 is disposed in the recess 22. In other words, the inorganic layer in the recess 22 may include the first inorganic layer 15 only.

In this disclosure, in a direction that is perpendicular to the normal direction of the substrate 10 (such as the X direction in FIG. 4), the side portions 22A of the recess 22 may be defined as the portions of the recess 22 that have one fifth of the total width of the recess 22 calculated from the left side and right side of the recess 22, and the central portion 22B may be defined as the portion of the recess 22 that at the central and has three fifths of the total width of the recess For example, as shown in FIG. 4, the width of each of the side portions 22A at the left side and the right side of the central portion 22B is respectively one third of the width of the central portion 22B in X direction.

In some embodiments, the curved profile of the first part 23A may be located in the recess 22 which is a space located between an extending plane (shown by a dashed line) of a bottom surface 18A of the buffer layer 18 and a bottom surface 22C of the recess 22. Furthermore, in some embodiments, the curved profile of the first part 23A may be located outside of the recess 22, such as higher than the bottom surface 18A of the buffer layer 18 in Z direction. The curved profile of the interface 23 (which includes the first part 23A and the second part 23B) may reduce the occurrence of turbulent flow when disposing the liquid raw material of the second organic layer 17 flowing into the recess 22 (no matter the turbulent flow occurs inside the recess 22 or outside of the recess 22), so that the chance to form a gap between the second organic layer 17 and the first inorganic layer 15 may be reduced, and the combination of second organic layer 17 and the first inorganic layer 15 may be better.

Similar to FIG. 3, in some embodiments shown in FIG. 4, the thickness T6 of the first inorganic layer 15 may be greater than the thickness T5 of the first inorganic layer 15, but the present disclosure is not limited thereto. For example, in the recess 22, the thickness T5 may be the distance measured from the bottom of the first inorganic layer 15 to the top of the first inorganic layer 15 at a central point MC, wherein the central point MC is a central point of a side portion 22A in X direction, and the thickness T6 may be the distance measured from the bottom of the first inorganic layer 15 to the top of the first inorganic layer 15 at a central point MD of the central portion 22B.

It should be noted that as shown in FIG. 2, the second inorganic layer 16 and the first organic layer 30 may be located over the recess 22. The second inorganic layer 16 may be disposed on the second organic layer 17, and the first organic layer 30 may be disposed on the second inorganic layer 16. In other words, the first inorganic layer 15, the second organic layer 17, the second inorganic layer 16, and the first organic layer 30 may be sequentially arranged in Z direction over the recess 22.

In summary, an electronic device is provided, and particularly to a structure in a periphery region of display panel. The electronic device may include a substrate an inorganic layer, and an organic layer. The substrate may have a recess with a side portion. The inorganic layer may be disposed on the substrate. The organic layer may be disposed on the inorganic layer. The organic layer and the inorganic layer may have an interface, the interface may include a first part corresponding to the side portion of the recess, and the first part may include a curved profile. The curved profile may reduce the occurrence of turbulent flow when disposing the liquid raw material of the layers on the substrates, so that the layers may be combined better to strengthen the periphery region of the display panel.

The electronic device may have touch-control functionality, to act as a touch-electronic device. Furthermore, the electronic device or touch-electronic device in the embodiments of the present disclosure may be applied in any electronic devices with a display screen, such as a display, a mobile phone, a watch, a laptop computer, a video camera, a camera, a mobile navigation device, or a television. These are merely examples, and the applications of the present disclosure are not limited thereto. The touch-electronic device of the aforementioned embodiments of the present disclosure may be applied in an electronic device that has an antenna, or in other types of electronic devices. Since the aforementioned embodiments in the disclosure may perform substantially the same function and obtain substantially the same results, some embodiments of the present disclosure may be combined without conflicting with the spirit of the disclosure.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. An electronic device, comprising:
a substrate, having a recess with a side portion and a central portion;
an inorganic layer, disposed on the substrate; and
an organic layer, disposed on the inorganic layer,
wherein the organic layer and the inorganic layer have an interface, the interface comprises a first part corresponding to the side portion of the recess, and comprises a second part corresponding to the central portion of the recess, the first part comprises a curved profile, and the second part comprises another curved profile,
wherein the curved profile of the first part is located outside the recess, and
wherein a thickness of the inorganic layer at the central portion is greater than a thickness of the inorganic layer at the side portion.

2. The electronic device of claim 1, further comprising a buffer layer disposed between the substrate and the inorganic layer, wherein the buffer layer partially overlaps the recess in a normal direction of the substrate.

3. The electronic device of claim 2, wherein the buffer layer comprises a plurality of sub-layers.

4. The electronic device of claim 1, wherein the inorganic layer comprises:
a first inorganic layer; and
a second inorganic layer, wherein the first inorganic layer is located between the substrate and the second inorganic layer.

5. The electronic device of claim 4, wherein a portion of the first inorganic layer, a portion of the second inorganic layer, and a portion of the organic layer are disposed in the recess.

6. The electronic device of claim 5, further comprising another organic layer, wherein the first inorganic layer and the another organic layer are at least partially located between the second inorganic layer and the substrate.

7. The electronic device of claim 6, wherein the substrate further comprises a convex portion, and the convex portion at least partially overlaps the another organic layer in a normal direction of the substrate.

8. The electronic device of claim 7, wherein the substrate further comprises another recess, and the convex portion is located between the recess and the another recess.

9. The electronic device of claim 8, wherein the first inorganic layer, the another organic layer, the second inorganic layer, and the organic layer are sequentially arranged over the another recess.

10. The electronic device of claim 7, wherein the substrate further comprises an accommodating recess, and the accommodating recess is located between the recess and the convex portion.

11. The electronic device of claim 10, wherein first inorganic layer directly contacts and overlaps the second inorganic layer in the accommodating recess.

12. The electronic device of claim 10, wherein a portion of organic layer and a portion of the another organic layer are disposed in the accommodating recess.

13. The electronic device of claim 4, wherein a thickness of the first inorganic layer is greater than a thickness of the second inorganic layer.

14. The electronic device of claim 1, wherein the recess is a groove.

15. The electronic device of claim 1, wherein the recess is a blind hole.

16. The electronic device of claim 1, wherein the first part is S-shaped.

17. An electronic device, comprising:
a substrate, having a recess with a side portion and a central portion;
an inorganic layer, disposed on the substrate; and
an organic layer, disposed on the inorganic layer,
wherein the organic layer and the inorganic layer have an interface, the interface comprises a first part corresponding to the side portion of the recess, and comprises a second part corresponding to the central portion of the recess, the first part comprises a curved profile, and the second part comprises another curved profile, and
wherein a thickness of the inorganic layer at the central portion is greater than a thickness of the inorganic layer at the side portion.

* * * * *